US007733697B2

(12) United States Patent
Picca et al.

(10) Patent No.: US 7,733,697 B2
(45) Date of Patent: Jun. 8, 2010

(54) PROGRAMMABLE NAND MEMORY

(76) Inventors: Massimiliano Picca, Via Bellini, 11, I-20053 Muggio' (MI) (IT); Stefano Zanardi, Via Carducci, 4, I-24068 Seriate (BG) (IT)

( * ) Notice: Subject to any disclaimer, the term of this patent is extended or adjusted under 35 U.S.C. 154(b) by 0 days.

(21) Appl. No.: 11/183,229

(22) Filed: Jul. 14, 2005

(65) Prior Publication Data
US 2006/0018159 A1      Jan. 26, 2006

(30) Foreign Application Priority Data
Jul. 14, 2004   (EP)   ................................. 04103354

(51) Int. Cl.
*G11C 11/34*   (2006.01)
*G11C 16/06*   (2006.01)
(52) U.S. Cl. .................. 365/185.09; 365/200; 365/201
(58) Field of Classification Search ................. 365/200, 365/185.09, 201
See application file for complete search history.

(56) References Cited

U.S. PATENT DOCUMENTS

| 5,579,265 | A   |   | 11/1996 | Devin |            |
|-----------|-----|---|---------|-------|------------|
| 5,659,509 | A   | * | 8/1997  | Golla et al. | 365/200 |
| 5,774,646 | A   | * | 6/1998  | Pezzini et al. | 714/42 |
| 6,507,518 | B2  | * | 1/2003  | Hosono et al. | 365/185.22 |
| 2002/0048191 | A1 | * | 4/2002 | Ikehashi et al. | 365/185.22 |
| 2003/0035322 | A1 |   | 2/2003 | Wong |            |

FOREIGN PATENT DOCUMENTS

| EP | 0 537 973 A2 | 4/1993 |
| EP | 0 637 034 A1 | 2/1995 |

OTHER PUBLICATIONS

European Search Report for EP 04 10 3354 dated Apr. 25, 2005.

* cited by examiner

*Primary Examiner*—Hoai V Ho
*Assistant Examiner*—Kretelia Graham
(74) *Attorney, Agent, or Firm*—Blakely, Sokoloff, Taylor & Zafman LLP

(57) ABSTRACT

An electrically programmable memory including: an array of a plurality of memory cells arranged accordingly to a NAND architecture, said memory cells grouped into a plurality of memory blocks and each memory block including a plurality of memory pages; means for receiving an address corresponding to a respective memory block; selecting means for selecting the addressed memory block; and means for detecting a failure of the addressed memory block, wherein the means for detecting a failure includes: a plurality of registers, each register corresponding to a respective memory block and storing an indication of the failure of the respective memory block; and means for reading the register corresponding to the addressed memory block in response to the receiving of the address, and wherein the programmable memory further includes at least one redundant memory block of memory cells including a plurality of redundant memory pages, the selecting means selecting the at least one redundant memory block in place of the addressed memory block in response to the reading of the indication of the failure.

13 Claims, 4 Drawing Sheets

PROGRAMMABLE NAND MEMORY

PRIORITY CLAIM

This application claims priority from European patent application No. EP04103354.9, filed Jul. 14, 2004, which is incorporated herein by reference.

TECHNICAL FIELD

The present invention generally relates to the field of solid-state memories, particularly to semiconductor memories and, even more particularly, to the field of non-volatile memories. Specifically, an embodiment of the invention relates to non-volatile memories that are electrically programmable.

BACKGROUND

Non-volatile memories are commonly used in several applications when the data stored in the memory need to be preserved even in absence of power supply. Within the class of non-volatile memories, electrically programmable (and erasable) memories, such as flash memories, have become very popular in applications in which the data to be stored are not immutable (as it might be case of, e.g., a consolidated code for a microprocessor), being instead necessary from time to time to store new data, or to update the data already stored. Examples of such applications include memory cards of the type used for example in digital cameras.

Typically, the memory includes an arrangement of memory cells, disposed for example in rows and columns, so as to form a matrix. Depending on the way the memory cells in the matrix are interconnected, a so-called NAND architecture for the flash memories can be identified. Roughly speaking, in a NAND architecture, groups of memory cells of a same matrix column are serially interconnected so as to form respective strings, which strings are then connected in parallel to each other to a same bit line. NAND flash memories are compact (a low number of contacts in the matrix are required), and they are suited for applications such as file storage.

In the NAND architecture, the memory space is ideally partitioned into a plurality of memory pages, each page corresponding to a group of memory cells that, in operation, are read or written simultaneously, i.e. in parallel to each other. The number of memory cells in each group determines the size (i.e., the number of bits) of the memory page. Nowadays, memory pages of 512 Bytes are rather typical, but larger memory pages are also encountered, for example of 2 KBytes.

The memory space is further logically partitioned into a plurality of memory blocks or sectors, each memory block including a plurality of memory pages that, in operation, are erased simultaneously.

Before shipping, each NAND memory undergoes a testing phase in which some invalid memory blocks, i.e. containing invalid data bits not repairable, can be found. The invalid memory blocks (in jargon, referred to as "bad" blocks) are "marked" before utilization by programming a number of memory cells inside each bad block with a predetermined string of bits.

In addition, during the lifetime of the NAND memories (typically, of about ten years), a percentage of the initially valid memory blocks can become invalid after having endured cycles of erase or write operations (typically, the manufactures guarantee that at most 2% of the total number of the memory blocks may become bad during the expected lifetime).

Because the bad blocks are randomly scattered throughout the NAND memories, it is often necessary to map them so that they are not used, i.e. not addressed in either read or program.

In solutions known in the art, an external device that performs operations on the NAND memory, such as a microprocessor or a microcontroller, preliminarily scans the NAND memory for locating the bad blocks. The external device creates, stores, and manages a mapping, in terms of the memory addresses, of the NAND memory particularly of the bad blocks, using for example an additional non-volatile memory external to the NAND memory. Typically, the external memory is a Content Addressable Memory, and before any operation, the external device compares the memory address to be provided to the NAND memory with the mapping stored in the CAM; then, the external device discards and substitutes invalid memory addresses.

As a consequence, the managing of the operations to be performed on the NAND memory is greatly complicated, mainly because the managing of the bad blocks internal to the NAND memory is not transparent to the external user.

Furthermore, it has to be considered that finding bad blocks in a NAND memory implies an inevitable reduction of its storage capability, which contrasts with the increasing request for memories with greater and greater sizes.

SUMMARY

In view of the state of the art outlined in the foregoing, one of the problems engineers have faced has been how to provide a NAND memory ensuring a simple managing of the bad blocks.

Accordingly, an embodiment of the present invention provides a managing of the bad blocks randomly scattered throughout the NAND memory, which is as far as possible transparent to the user, thus providing for a user viewing the memory from the outside, a "continuity" of the memory blocks.

BRIEF DESCRIPTION OF THE DRAWINGS

Features and advantages of the present invention will be made apparent by the following description of an embodiment thereof, provided merely by way of non-limitative example, description that will be conducted making reference to the attached figures, in which.

DETAILED DESCRIPTION

Figure 1:
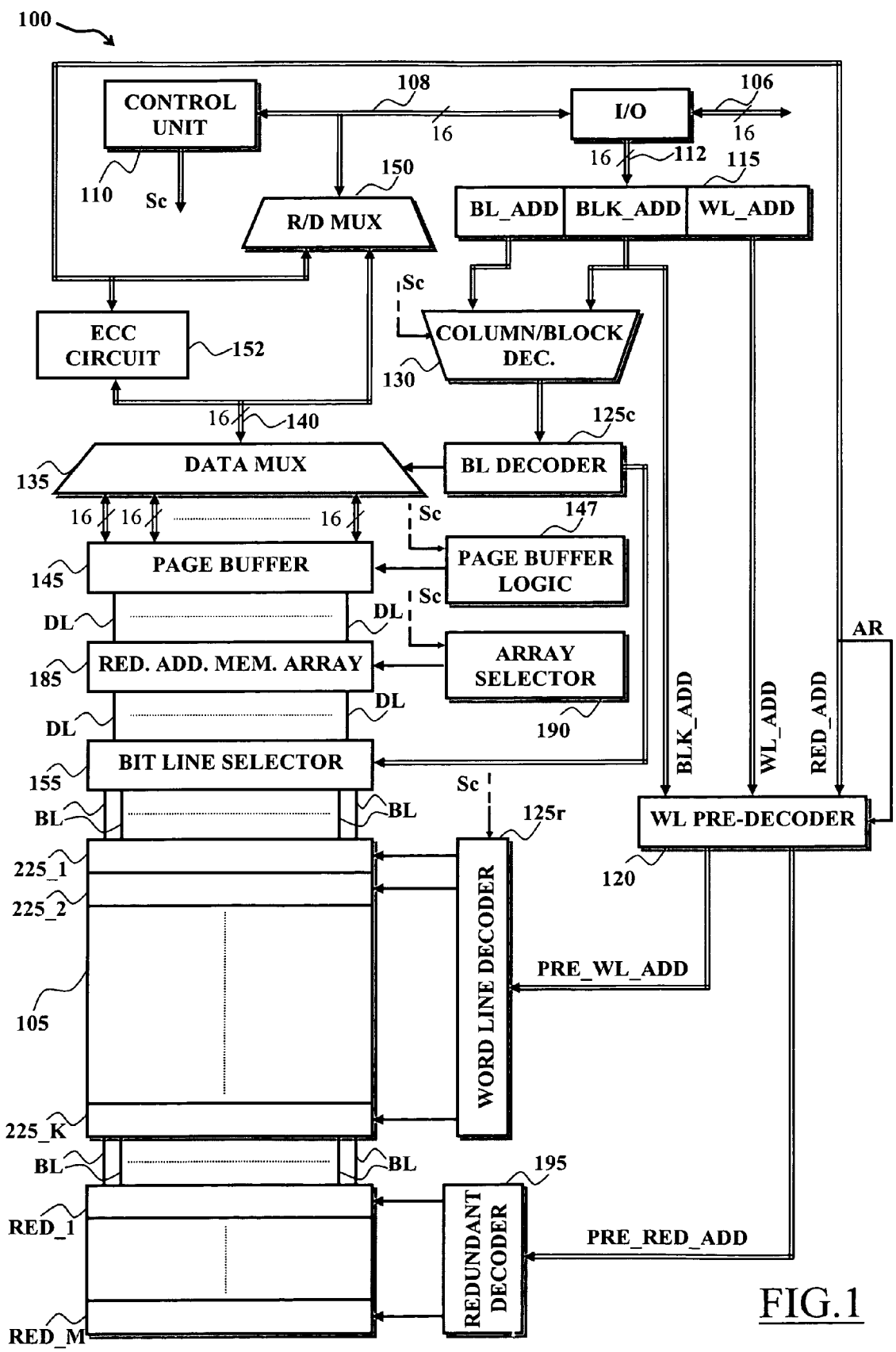
FIG. 1 is a detailed block diagram of a NAND memory according to an embodiment of the present invention.

With reference to the drawings, FIG. 1 is a detailed block diagram of a non-volatile semiconductor memory 100 according to an embodiment of the present invention, particularly an electrically-programmable, non-volatile semiconductor memory, such as a flash memory. The flash memory 100 is integrated in a chip of semiconductor material and includes an arrangement 105 of a plurality of memory cells having a so-called NAND architecture (described in greater detail in the following).

The flash memory 100 interfaces with the outside world through I/O terminals coupled to respective I/O buffers, globally referred to as I/O interface I/O; typically, the flash memory 100 is provided with eight or sixteen I/O terminals.

An external device, such as a microprocessor (not shown in the drawing), can communicate with the flash memory 100 through the I/O interface I/O, which in use is typically connected to an external bus 106 on, e.g., a printed circuit board, and can access the memory 100 to perform an operation on the arrangement 105 of memory cells, e.g. a read, a write, or an erase operation. Through the I/O interface I/O the flash memory 100 receives from the microprocessor command codes corresponding to the operation to be executed, memory addresses for selecting a desired portion of the arrangement 105 of memory cells, and data to be written in the addressed portion of the memory cell arrangement 105. Furthermore, through the I/O interface I/O, the flash memory 100 provides to the microprocessor data read from the addressed portion of the memory cell arrangement 105, and possibly communication codes indicative, for example, of a failure of the operation required by the microprocessor.

The data to be written and the command codes received from the microprocessor by means of the I/O interface I/O are provided to other functional blocks of the flash memory 100 through a communication bus 108, consisting of a number of signal lines equal to the number of the I/O terminals, for example, sixteen signal lines. Furthermore, the communication bus 108 is exploited by the flash memory 100 for transmitting towards the I/O interface I/O the data read and the communication codes to be provided to the microprocessor; in other words the bus 108 is bidirectional.

The flash memory 100 includes a control unit 110 connected to the communication bus 108, which manages the operation of the flash memory 100 and which, particularly, is capable of interpreting the command codes provided by the microprocessor and of managing the timing of the flash memory 100. The control unit 110 provides to the other functional blocks of the flash memory 100 control signals, globally referred to as Sc.

The flash memory 100 further comprises an address bus 112, connected to the I/O interface I/O, which transmits the memory addresses received from the microprocessor to an address register 115.

Figure 2:
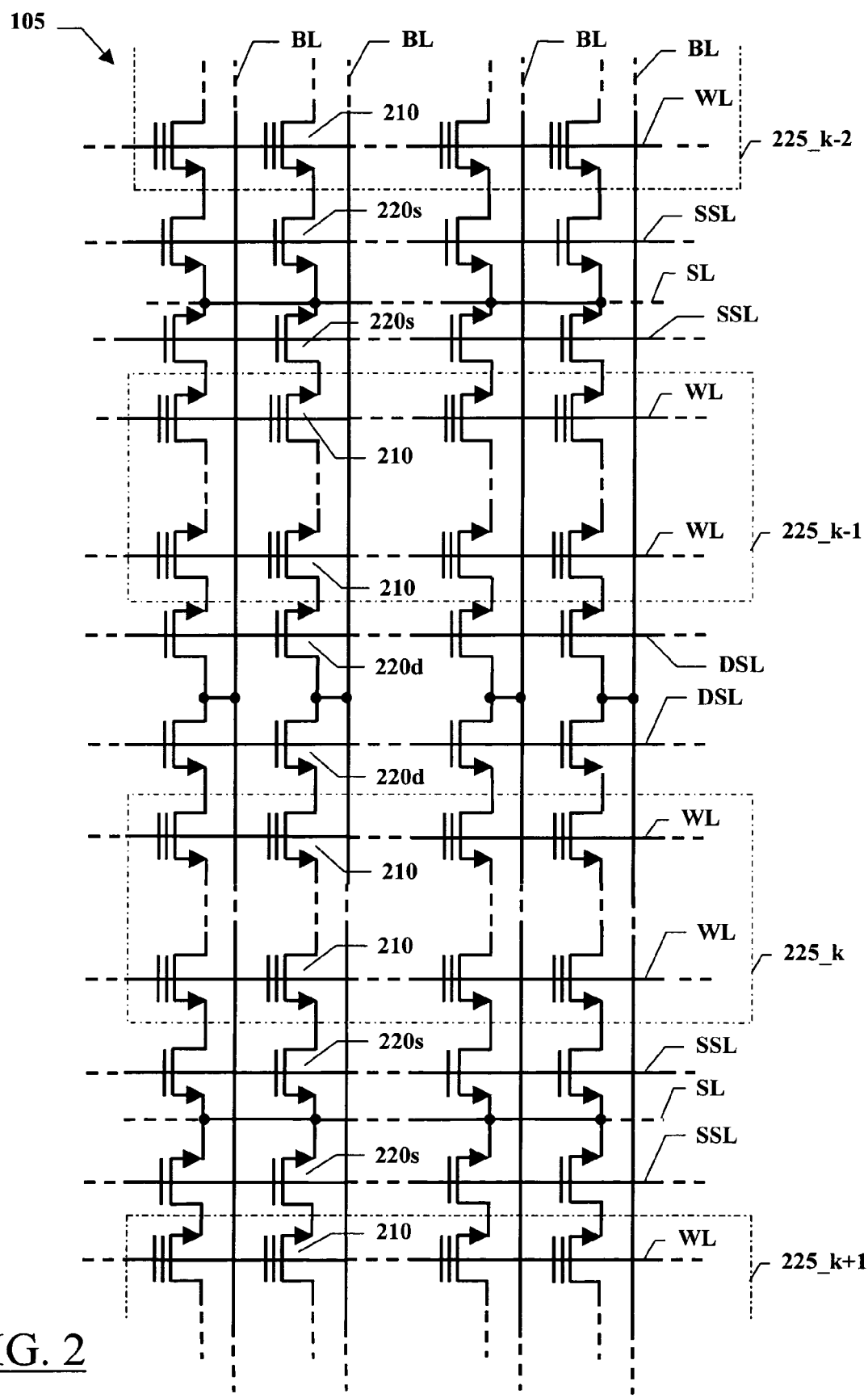
FIG. 2 shows in detail the NAND architecture of an arrangement of a plurality of flash memory cells included in the NAND memory of FIG. 1 according to an embodiment of the invention.

The NAND architecture of the memory cell arrangement 105 is described with reference to FIG. 2.

Typically, each memory cell 210 consists of an N-channel MOS transistor having a charge-storage element, such as a conductive floating gate adapted to be charged by injected electrons. Without entering into excessive details, well known to those skilled in the art, in an erased condition (associated by convention with a logic value '1'), the memory cell 210 has a low threshold voltage value. The memory cell 210 is programmed by injecting electric charges into its floating gate: in the programmed condition (associated by convention with a logic value '0'), the memory cell 210 has a high threshold voltage value. Therefore, when a selected memory cell 210 is biased for reading its content, the memory cell 210 will be conductive if erased or non-conductive if programmed.

The arrangement 105 of the plurality of memory cells 210 consists of a matrix having a plurality of columns (for example, 8192 columns) and a plurality of rows (for example, 2048 rows).

In the memory matrix 105, groups of, e.g., eight, sixteen or even more (e.g., thirty-two) memory cells 210 are connected in series to each other to form a respective memory-cell string, and different memory cell strings belonging to a same matrix column are connected in parallel to each other to a same bit line BL.

The memory cells 210 of a generic string are in particular connected in series between a source select N-channel MOS transistor 220s and a drain select N-channel MOS transistor 220d. A generic, intermediate memory cell 210 in the memory cells string has the drain terminal connected to the source terminal of an adjacent memory cell 210, and the source terminal connected to the drain terminal of another adjacent memory cell 210. One of the two end memory cells 210 located at the ends of the string has the drain terminal connected to the source terminal of the drain select transistor 220d; the drain terminal of the drain select transistor 220d is connected to the corresponding bit line BL, as well as to the drain terminal of the corresponding drain select transistor 220d of an adjacent memory cells string. Likewise, the other end memory cell 210 of the string has the source terminal connected to the drain terminal of the source select transistor 220s; the source terminal of the source select transistor 220s is connected to the source terminal of the corresponding source select transistor 220s of another adjacent memory cells string.

The control gate terminals of the memory cells 210 in each row are connected to a corresponding word line WL. The gate terminals of the drain select transistors 220d belonging to a common row of the memory matrix 105 are all connected to a corresponding drain select line DSL; similarly, the gate terminals of the source select transistors 220s belonging to a common row are all connected to a corresponding source select line SSL. The drain terminals of the drain select transistors 220d belonging to a common column of the memory matrix 105 are connected to a corresponding bit line BL. Conversely, the source terminals of all the source select transistors 220s in the memory matrix 105 are connected to a common source line SL (which is typically kept at a reference voltage, or ground).

The memory cells 210 belonging to the same row, and thus connected to the same word line WL, are logically partitioned into memory pages. Assuming, merely by way of example that the matrix 105 includes 8192 bit lines BL, two memory pages of 512 Bytes each for each word line WL are defined, a first page consisting for example of the memory cells 210 in an even position, and a second page consists of the memory cells 210 in an odd position; thus, if, still by way of example, the memory matrix 105 includes 2048 word lines WL, the flash memory 100 has a total of 4096 memory pages of 512 Bytes each.

The memory cells 210 of the matrix 105 are further logically partitioned into a number K of memory blocks 225_1-225_K. Each generic memory block 225_k includes the same number of columns of the matrix 105 and a number of rows equal to the number of memory cells 210 included in a string, i.e., the memory cells 210 connected in series between a drain select line DSL and a source select line SSL. Assuming by way of example that each string includes sixteen memory cells and that each word line WL is associated with two memory pages, each memory block 225_k includes thirty-two memory pages. Still by way of example, if the memory matrix 105 includes 2048 word lines WL, the number K of memory blocks 225_1-225_K is equal to 128.

It is pointed out that the number of bit lines and word lines as well as the size of the memory page and of the memory block, may greatly vary, not being a limitation for the present invention. In particular, the number of memory pages that are associated with a generic word line may be higher than two, particularly multiples of two, such as four, eight and so on.

Referring back to FIG. 1, the memory matrix 105 is schematically shown partitioned into the number K of memory blocks 225_1-225_K.

The address register 115 is loaded with a memory address provided through the address bus 112 for selecting a memory page to be read or programmed, or a memory block to be erased. In the memory address, three portions can be distinguished, i.e. a portion (bit line address BL_ADD) indicative of which bit lines BL are to be selected, a portion (block address BLK_ADD) indicative of which memory block is to be selected and a portion (word line address WL_ADD) indicative of which word line inside the memory block is to be selected.

A memory page is selected during a read or a write operation by properly biasing a given word line in response to the word line address WL_ADD and to the block address BLK_ADD, and by selecting a packet of bit lines BL in response to the bit line address BL_ADD. For example, if two memory pages exist for each word line, one page corresponds to the memory cells in even position and the other page corresponds to the memory cells in odd position. Then, the packet of selected bit lines BL includes all the bit lines BL in even position or all the bit lines BL in odd position, and one bit is sufficient for addressing the desired packet of bit lines. Considering by way of example that the flash memory 100 includes 4096 memory pages, 12 bits are sufficient for selecting the desired memory page. Particularly, considering that the flash memory 100 includes 128 memory blocks, including 32 memory pages each, the block address BLK_ADD is of 7 bits, the word line address WL_ADD is of 4 bits and the bit line address BL_ADD is of one bit.

A memory block 225_k is selected during an erase operation by selecting the plurality of the associated word lines and all the bit lines BL.

The flash memory 100 comprises a word line pre-decoder 120 receiving the block address BLK_ADD and the word line address WL_ADD from the address register 115. In response to the pre-decoding of the block address BLK_ADD and of the word line address WL_ADD, the word line pre-decoder 120 provides a pre-decoded word line address PRE_WL_ADD.

The pre-decoded word line address PRE_WL_ADD is then provided to a word line decoder 125r, control signals provided by the control unit 110 are adapted to indicate if the operation to be performed is a read, write or erase. The word line decoder 125r accordingly selects the drain select line DSL and the source select line SSL of the desired memory block 225_k and biases the associated word lines to appropriate voltages, depending on the operation to be performed.

The flash memory 100 also includes a column/block multiplexer 130 (hereinafter shortly referred to as column/block mux) receiving the bit line and block addresses BL_ADD and BLK_ADD from the address register 115. The column/block mux 130 receives also a control signal from the control unit 110 and selectively outputs the bit line address BL_ADD or the block address BLK_ADD (as described in greater detail in the following).

The bit line address BL_ADD or the block address BLK_ADD, selected through the column/block mux 130, is provided to a bit line decoder 125c. According to the decoding of the address selected by the column/block mux 130, a data multiplexer 135 (data mux) enables connections between a data bus 140 of the flash memory 100, consisting of a number of signal lines equal to the number of signal lines of the communication bus 108 (for example, sixteen signal lines), and a corresponding, selectable portion of a page buffer 145.

The page buffer 145 is adapted to read/write a data word (consisting of, e.g., 512 Bytes) from/into the memory pages of the memory matrix 105 and is exploited as a temporary storage of the data word read or to be written during read/write operations on the memory matrix 105. The operation of the page buffer 145 is generally managed by a page buffer logic control unit, schematized as a block identified as 147, receiving respective control signals from the control unit 110.

The data bus 140 is connected to the communication bus 108 through a R/D multiplexer 150 (hereinafter shortly referred to as R/D mux) for receiving the data word to be written into a memory page of the memory matrix 105, or for transmitting a data word read from a memory page of the memory matrix 105. The data word is serially received from, or transmitted to, the I/O interface I/O in chunks of p data bits at a time, where p is the number of the I/O terminals of the I/O interface I/O (for example, p=16). The R/D mux 150 is exploited to provide the received p data bits both directly to the data mux 135 and to an Error Checking/Correcting circuit 152. The ECC circuit 152 provides, for example, a parity bit exploited for error detection corresponding to the received data bits; the parity bit in turn is to be provided to the data mux 135 together with the corresponding data bits. Furthermore, when the ECC circuit 152 receives the parity bit together with the corresponding data bits, it verifies the correctness thereof and corrects a possible error.

Data lines DL connected to the page buffer 145 are selectively connectable to the bit lines BL of a selected page, e.g. the bit lines BL in even or odd position, through a bit line selector 155. The bit line selector 155 receives the decoded bit line address from the bit line decoder 125c and accordingly selects the desired bit lines by biasing them to appropriate voltages.

During a read operation, a data word stored in the memory page selected by the word line decoder 125r and by the bit line selector 155 is read out and latched into the page buffer 145, thanks to the connections with the data lines DL. Successively, the read data word, temporarily stored in the page buffer 145, is completely or partly serially outputted through the data mux 135 in chunks of p bits at a time, according to the selection carried out by the bit line decoder 125c, on the basis of the bit line address BL_ADD, and transferred on the data bus 140. Then, the R/D mux 150 connects the data bus 140 with the communication bus 108, for providing the selected p-bit chunks to the I/O interface I/O.

During a write operation, the data word to be written is received from outside the flash memory 100 through the I/O interface I/O in p-bit chunks at a time serially provided to the R/D mux 150 through the communication bus 108. Then, the R/D mux 150 transfers the p-bit chunks on the data bus 140 and the page buffer 145 is thus replenished with data bits by the data mux 135 in a sequence of steps. When the page buffer 145 has eventually been filled, the data bits, transferred on the data lines DL, are written in parallel into the memory cells of a given selected page.

In this way, the data mux 135 is exploited for fitting an internal data parallelism of the flash memory 100 with an external data parallelism. Accordingly, the data mux 135 transmits p data bits at a time from the page buffer 145

(having a storage capability of, for example, 512 Bytes) to the data bus 140, and vice versa; the data mux 135 is adapted to select in succession appropriate portions of the page buffer 145.

In addition, the flash memory 100 according to an embodiment of the present invention includes, at least one, preferably a number M of redundant memory blocks RED_1-RED_M (for example, M=4), each one having the same architecture and size as a generic memory block 225_k. Particularly, the redundant memory blocks RED_1-RED_M have the bit lines BL in common with the memory blocks 225_1-225_K, and additional word lines are provided for selecting a generic redundant memory block RED_m or a memory page inside the redundant memory block RED_m. The redundant memory blocks RED_1-RED_M are exploited in place of the memory blocks 225_1-225_K that during an IC test phase before shipping, or during the memory operating lifetime, become invalid (i.e. blocks that are or go bad), i.e. that cannot be read or written successfully. In detail, if a memory block 225_k is invalid, it can no longer be exploited for storing data, and one of the redundant memory blocks RED_1-RED_M is used in substitution.

The flash memory 100 further includes a non-volatile redundancy address memory array 185 for storing a mapping of the bad blocks and information about the redundant memory blocks RED_1-RED_M used in substitution thereof.

The redundancy address memory array 185 comprises an arrangement of a plurality of flash memory cells having a NAND architecture. The redundancy address memory array 185 may exploit as bit lines the data lines DL connected to the page buffer 145, in such a way that the page buffer 145 is exploited for reading/writing also the redundancy address memory array 185. Preferably, the redundancy address memory array 185 is not included in the memory matrix 105, being separated by the bit line selector 155. In this way, during a write or an erase operation on the memory matrix 105, the memory cells 210a of the redundancy address memory array 185 do not undergo related stresses, accordingly assuring a greater reliability.

Figure 3A:
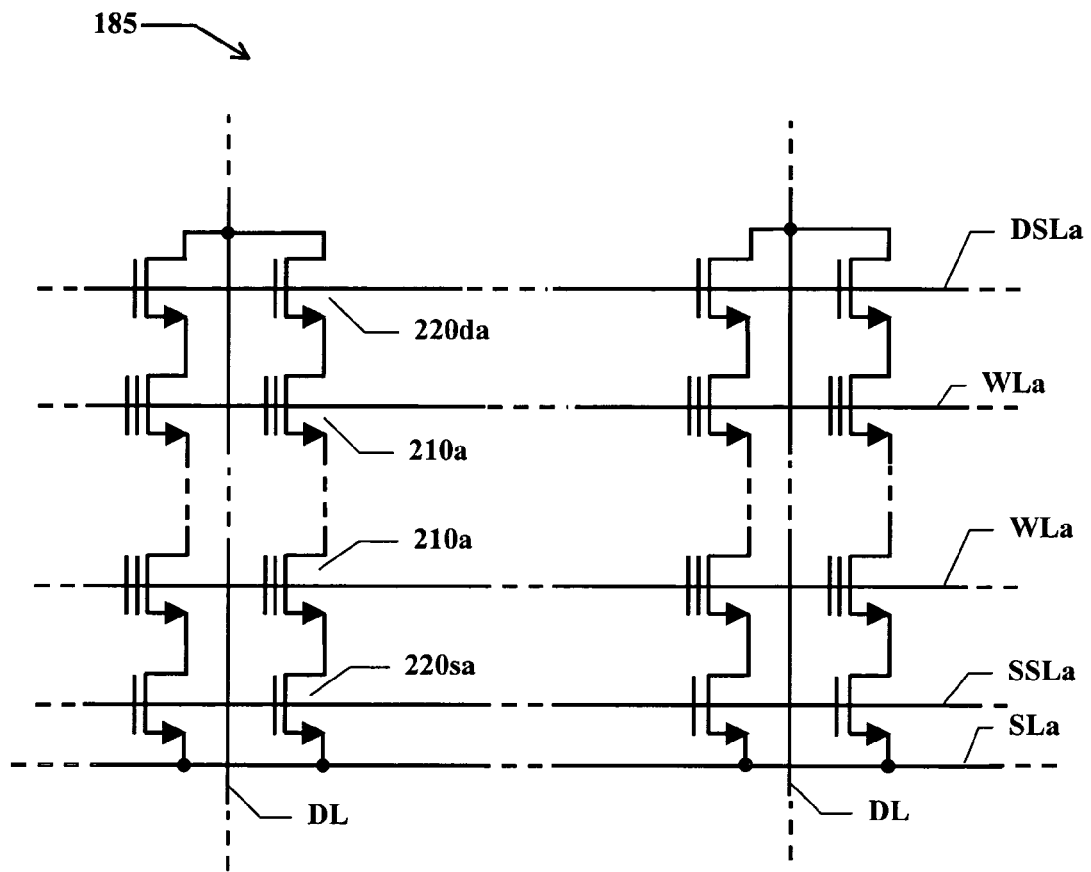
FIG. 3A shows a NAND array of a plurality of flash memory cells included in the NAND memory of FIG. 1, exploited for storing information about memory blocks of the NAND memory according to an embodiment of the invention.

An exemplifying structure of the redundancy address memory array 185 is described with reference to FIG. 3A. The architecture of the redundancy address memory array 185 is analogous to the architecture of the memory matrix described with reference to FIG. 2 and may comprise, for example, a single block of memory cells 210a. In detail, the redundancy address memory array 185 may comprise a single drain select line DSLa, a single source select line SSLa, and a common source line SLa. A plurality of strings of memory cells 210a is connected between the drain select line DSLa and the source select line SSLa by means of respective drain select transistors 220da and source select transistors 220sa.

Each data line DL may be connected to two respective strings of memory cells 210a in parallel, each string comprising, e.g., sixteen memory cells 210a, in such a way that a write operation on the redundancy address memory array 185 programs a same data bit in two memory cells 210a at a time. Each row of memory cells 210a is controlled by a respective word line WLa. For example, only one row of memory cells 210a of the redundancy address memory array 185, with the respective word line WLa, can be exploited or, alternatively, each row of memory cells 210a can store the same data bits, the word lines WLa being connected together. Such a structure advantageously permits to exploit the same process for fabricating, and the same circuitry for reading/writing, both the memory matrix 105 and the redundancy address memory array 185. However, it is not excluded that the redundancy address memory array 185 has a different architecture. Furthermore, the described structure of the redundancy address memory array 185 with two selected memory cells in parallel to the respective data line DL brings to a better data retention and to a faster read operation with respect to a memory array having one selected memory cell for each data line.

Figure 3B:
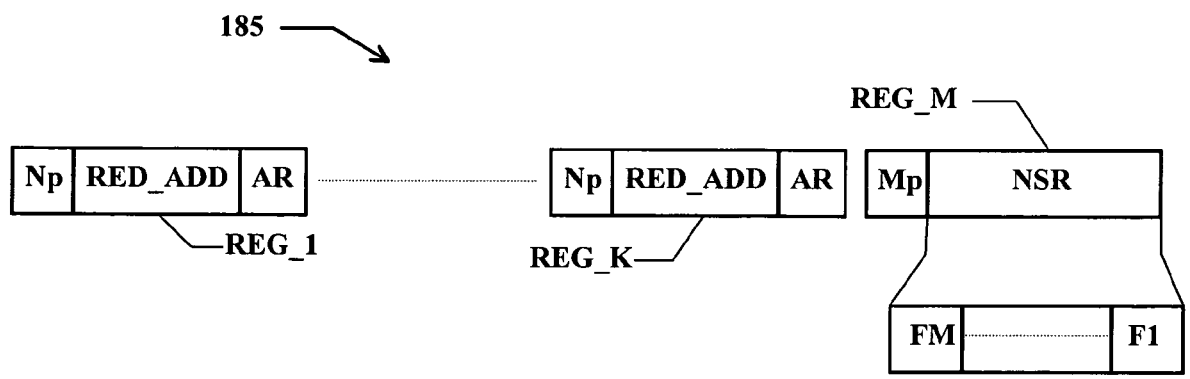
FIG. 3B represents extremely schematically the memory cell array of FIG. 3A locally partitioned into a plurality of registers according to an embodiment of the invention.

Considering FIG. 3B, the redundancy address memory array 185, included in the flash memory according to an embodiment of the present invention, is represented as being logically partitioned into a number K of matrix memory registers REG_1-REG_K plus a redundancy memory register REG_M. The generic matrix memory register REG_k is associated with a respective memory block 225_k, while the redundancy memory register REG_M is associated with the redundant memory blocks RED_1-RED_M.

The generic matrix memory register REG_k is exploited for storing a flag bit AR, taking a low logic value '0' if the associated memory block 225_k is a bad block, and taking a high logic value '1' if the associated memory block 225_k is a "good" (i.e., working) block.

If the associated memory block 225_k is a bad block, the matrix memory register REG_k further stores a redundancy address in a redundancy address field RED_ADD, which selects the redundant memory block RED_m exploited in substitution thereof. If the associated memory block 225_k is a "good" block, the stored information in the redundancy address field RED_ADD of the matrix memory register REG_k is not relevant.

In addition, the matrix memory register REG_k preferably stores a parity bit Np corresponding to the content of the redundancy address field RED_ADD.

The redundancy memory register REG_M is exploited for storing information about the redundant memory blocks RED_1-RED_M. Particularly, the redundancy memory register REG_M stores a string NSR of M flag bits F1-FM plus a parity bit Mp corresponding to the string NSR. Each flag bit F1-FM of the string NSR is associated with a respective redundant memory blocks RED_1-RED_M; for example, the less significant flag bit F1 of the string NSR is associated with the redundant memory blocks RED_1, the successive flag bit F2 with the redundant memory blocks RED_2 and so on, the most significant bit FM being associated with the redundant memory block RED_M. Each flag bit F1-FM of the string NSR takes a low logic value '0' when the associated redundant memory block RED_m is exploited in place of one of the memory blocks 225_1-225_K, whereas it takes a high logic value '1' when the redundant memory block RED_m is still unexploited.

Still referring to FIG. 1, the flash memory 100 is shown including an array selector 190 for selecting the matrix memory registers REG_1-REG_K and the redundancy memory register REG_M.

In detail, before a read, write or erase operation, the matrix memory registers REG_1-REG_K and the redundancy memory register REG_M are automatically selected by means of the array selector 190, controlled by the control unit 110, and the content of all of these registers is loaded into the page buffer 145. Then, through the data mux 135 the content of the redundancy addresses field RED_ADD of one of matrix memory registers REG_1-REG_K plus the respective parity bit Np and the flag bit AR are provided to the ECC circuit 152, according to the selection carried out by the bit line decoder 125c, on the basis of the block address BLK_ADD. The content of the redundancy address field RED_ADD plus the flag bit AR, possibly corrected by the ECC circuit 152, are then transmitted to the word line pre-decoder 120.

If the flag bit AR takes the high logic value '1' (i.e., when the addressed memory block 225_k is "good"), the word line pre-decoder 120 provides the pre-coded word line address PRE_WL_ADD to the word line decoder 125r. On the contrary, if the flag bit AR takes the low logic value '0' (i.e., when the addressed memory block 225_k is a bad block), the word line pre-decoder 120 receives the redundancy address RED_ADD and provides a pre-coded redundancy address PRE_RED_ADD in response to the word line address WL_ADD and to the redundancy address RED_ADD.

If the flag bit AR takes the low logic value '0' the pre-coded redundancy address PRE_RED_ADD is provided to a redundant word line decoder 195, which selects the word line(s) of the corresponding redundant memory block RED_1-RED_M.

Figure 4:
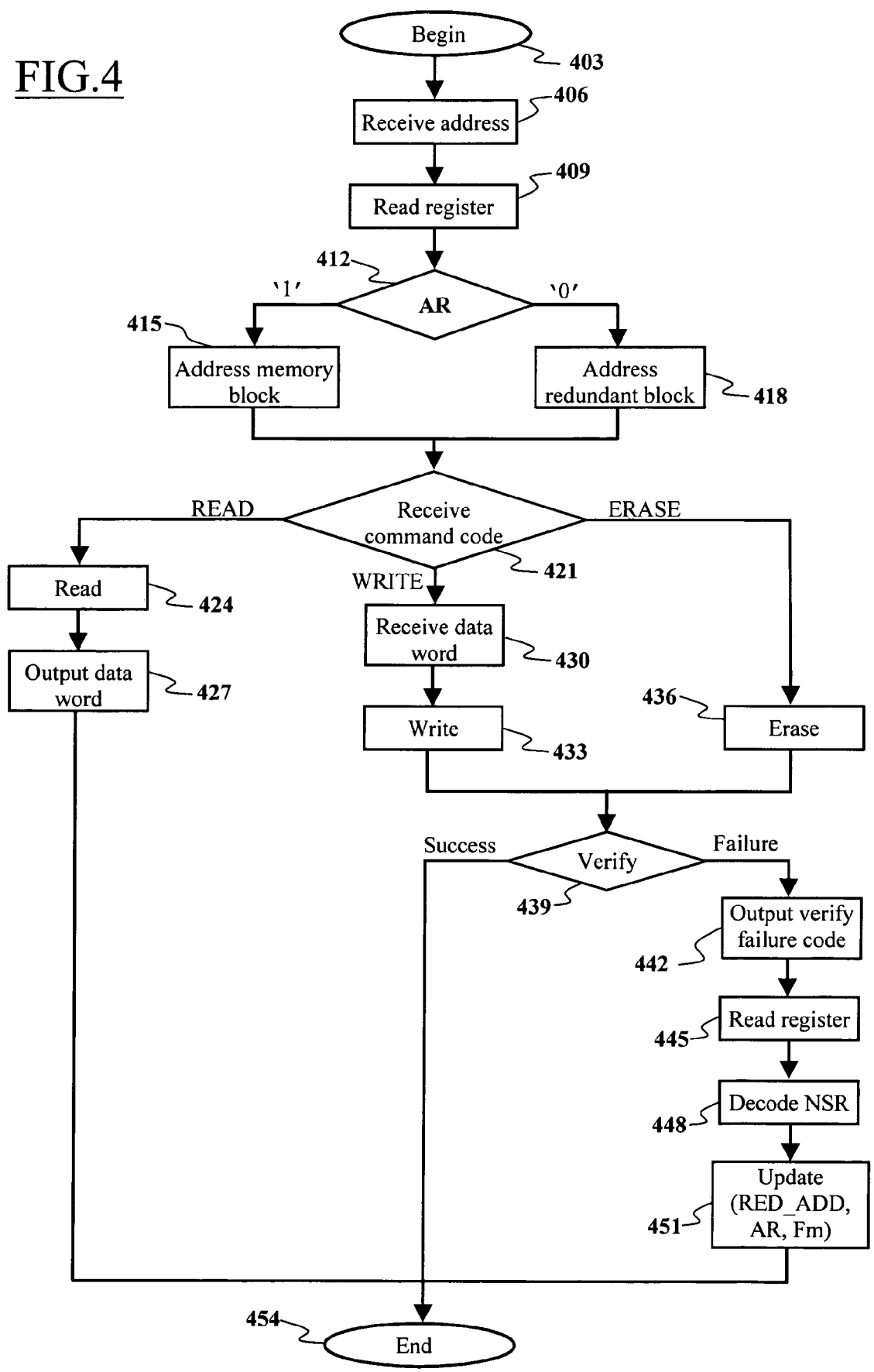
FIG. 4 is a flowchart diagram representing the operation of the NAND memory of FIG. 1 according to an embodiment of the invention.

In the following the read, write and erase operations performed on the flash memory 100 are described with reference to the flowchart of FIG. 4 in conjunction with FIG. 1 and FIG. 3B.

An operation to be performed on the flash memory 100 begins at 403. At 406, through the external bus 106 connected to the I/O interface I/O the external microprocessor provides to the flash memory 100 an address corresponding to the desired memory page of the memory matrix 105, to be read or written, or to a memory page in a desired memory block to be erased. The address is loaded into the address register 115 through the address bus 112.

At 409 the redundancy address memory array 185 is automatically selected by means of the array selector 190 and its content is transferred onto the data lines DL. The page buffer 145 reads out and latches the content of the whole redundancy address memory array 185.

Then, the column/block mux 130 provides the block address BLK_ADD (corresponding to the desired, addressed memory block 225_k) to the bit line decoder 125c, and the decoded block address is provided to the data mux 135. The data mux 135 selects the corresponding portion of the page buffer 145 storing the content of the matrix memory register REG_k (associated with the desired, addressed memory block 225_k) and, at 412, transfers the required flag bit AR and the content of the redundancy address field RED_ADD onto the data bus 140. The flag bit AR and the content of the redundancy address field RED_ADD are then provided to the word line pre-decoder 120, after having been verified and, possibly, corrected by the ECC circuit 152.

Successively, the array selector 190 de-selects the redundancy address memory array 185, and the column/block mux 130 provides the bit line address BL_ADD to the bit line decoder 125c. The bit line selector 155 selects the bit lines BL in even or odd position, according to the decoded bit line address.

If the flag bit AR takes the logic value '1' (i.e., if the addressed memory block 225_k is "good"), the word line address WL_ADD is pre-coded together with the block address BLK_ADD. The pre-coded word line address PRE_WL_ADD is provided to the word line decoder 125r for selecting the desired word line inside the respective memory block 225_k (415).

If the flag bit AR instead takes the logic value '0' (i.e., if the selected memory block 225_k is "bad"), the word line address WL_ADD is pre-coded together with the content of the redundancy address field RED_ADD of the selected register REG_k. Then, the pre-coded redundancy address PRE_RED_ADD is provided to the redundant decoder 195 for selecting the desired word line inside the redundant block RED_m exploited in place of the bad memory block 225_k (418).

At 421 the microprocessor further provides a command code, i.e. a read, write or erase command code, received through the communication bus 108 by the control unit 110, which in turn provides the corresponding control signals Sc to the other functional blocks of the flash memory 100. The order in which the address and the command code are received by the flash memory 100 is not relevant and, particularly, depends on the protocol of communication between the flash memory 100 and the external microprocessor.

It is supposed that a read operation has to be performed on the flash memory 100. The data word stored in the selected memory page of the memory matrix 105 is transferred on the data lines DL and it is read out and latched into the page buffer 145 (424). The data mux 135 transfers the read data word on the data bus 140 in chunks of p data bits at a time. Then, the data bit chunks are provided through the R/D mux 150 and the communication bus 108 to the I/O interface I/O for being serially outputted (427).

Supposing that a write operation has to be performed, the external microprocessor further provides to the flash memory 100 a data word (e.g. of 512 Bytes) to be written in the selected memory page (430). The data word is provided to the data mux 135 in data bit chunks through the I/O interface I/O, the communication bus 108 and the data bus 140; the data mux 135 loads the data word to be written into the page buffer 145 in a plurality of steps.

The bit line selector 155 selects the packet of bit lines BL in even or odd position according to the bit line address BL_ADD (as described above); then, the page buffer 145 transfers each data bit onto the respective data line DL. At 433 the word line WL associated with the memory page to be written is selected by the word line decoder 125r or by the redundant decoder 195, which apply the appropriate voltage for programming the selected memory page in the memory block 225_k or in one of the redundant memory blocks RED_1-RED_M, respectively, the redundancy address memory array 185 being kept de-selected.

In an erase operation (436) the bit line selector 155 selects all the bit lines BL and the word line decoder 125r brings all the word lines of the selected memory block 225_k, or the redundant decoder 195 brings all the word lines of the selected redundant block RED_m, to an appropriate voltage.

Typically, after any write or erase operation on a selected memory block 225_k, at 439 a verify phase follows (program verify or erase verify). If the verify phase reveals the success of the write or erase operation, the operation stops at 454.

In the case that the verify phase reveals a failure in the memory block 225_k (e.g. one or more memory cells not correctly programmed, or not erased), that memory block is to be used no more and, accordingly, it is "marked" as a bad block. In addition, according to an embodiment of the present invention, one of the redundant blocks RED_1-RED_M not yet exploited is associated with the bad memory block 225_k and used in substitution thereof.

For these purposes at 442 the control unit 110 of the flash memory 100 provides a verify failure code to the microprocessor, through the communication bus 108 and the I/O interface I/O.

Accordingly, the microprocessor substitutes the bad memory block 225_k with one of the redundant blocks RED_1-RED_M by providing a corresponding command code to the flash memory 100. In response to the received command code, the array selector 190 selects the redundancy address memory array 185 and the page buffer 145 reads out and latches the whole content thereof (445). The data mux 135 transfers the content of the redundancy memory register REG_M on the data bus 140 for being provided to the ECC circuit 152, which possibly corrects the read content. Then, the content of the redundancy memory register REG_M is provided to the control unit 110 for being updated.

The control unit 110, at 448, decodes the string NSR of flag bits and provides a redundancy address corresponding to one of the redundant blocks RED_1-RED_M not yet exploited; this redundancy address is written into the redundancy address field RED_ADD of the matrix memory register REG_k associated with the bad memory block 225_k. For example, it is supposed that the redundant blocks RED_1-RED_M have redundancy addresses consecutive to the addresses of the memory blocks 225_1-225_K. The control unit 110 can calculate the redundancy address by knowing a first redundancy address of a first redundant block RED_1 after the memory blocks 225_1-225_K; in detail, the control unit 110 increments the first redundancy address depending on the position of a flag bit Fm in the string NSR found not equal to '0'. Then, the control unit 110 modifies the received string NSR by bringing the flag bit Fm corresponding to the associated redundant block RED_m equal to the logic value '0'.

The control unit 110 further receives the content of the matrix memory register REG_k and brings the flag bit AR equal to the logic value '0' and the content of the redundancy address field RED_ADD equal to the calculated redundancy address of the redundant block RED_m.

The control unit 110 provides the updated content of the matrix memory register REG_k and of the redundant block RED_m to the ECC circuit 152 for calculating the corresponding parity bits Np and Mp and for providing them to the data mux 135 and to the page buffer 145.

When, at 451, the whole updated content of the redundancy address memory array 185 is latched into the page buffer 145, the redundancy address memory array 185 is selected (while the bit line selector 155 maintains the bit lines BL de-selected) and programmed accordingly to the data bits transferred on the data lines DL.

Finally, the microprocessor can retry the write or erase operation by addressing the desired memory block 225_k; in response to the address of the bad memory block 225_k, the flash memory 100 automatically addresses the associated redundant block RED_m in a way totally transparent to the microprocessor as described above.

Alternatively, the redundancy address memory array 185 may store not only the string NSR of flag bits indicating which redundant blocks RED_1-RED_M have yet been exploited, but also the corresponding redundancy addresses. In this way, when the control unit 110 decodes a flag bit Fm equal to '1', it receives also the requested redundancy address to be programmed into the matrix memory register REG_k.

Thanks to the NAND memory according to an embodiment of the present invention, the managing of the operations to be performed is greatly simplified, since the managing of the bad blocks is internal to the NAND memory. The mapping of the bad blocks is stored inside the NAND memory and is automatically read by the NAND memory before any operation. If the addressed memory block is found to be a bad block, the NAND memory automatically addresses the associated redundant block in a way totally transparent to the user, thus providing "continuity" to the memory blocks, since the NAND memory "hides" the randomly scattered bad blocks to the microprocessor. The user intervenes only after a failure of a write or an erase operation, but this typically happens only for a small percentage of memory block.

Furthermore, by providing a sufficient number of memory blocks, the NAND memory does not undergo a reduction of its storage capability when bad blocks are found during the operating lifetime.

It is also observed that also the failure of an erase or a write operation may be managed completely internally to the flash memory. In fact, after the failure, the microprocessor need not be informed through the failure code and the flash memory could automatically substitute a bad block with a redundant block. In this way, operations leading to the functional replacement of a bad block by a redundant block may be completely managed internally without the interaction of the external microprocessor.

Furthermore, it is pointed out that the solution devised for obtaining the above-mentioned advantages does not influence the performance of the flash memory according to the embodiment of the present invention and, particularly, it does not impact on the operation speed.

Although in the foregoing reference has been made to a page buffer having a storage capability equal to the data capability of a memory page, the page buffer can have a greater size. The memory pages can include also a spare area exploited, e.g., for storing parity bits corresponding to the stored data word and, accordingly, the flash memory can include a further ECC circuit for verifying the correctness of a data word read from, or to be written into, a memory page. However, the same ECC circuit exploited for the redundancy address memory array can be used also for the data words.

Furthermore, an electronic system, such as a computer system or camera, may incorporate the flash memory 100 of FIG. 1 according to an embodiment of the invention.

Although the present invention has been disclosed and described by way of an embodiment, it is apparent to those skilled in the art that several modifications to the described embodiment, as well as other embodiments of the present invention are possible without departing from the scope thereof as defined in the appended claims.

What is claimed is:

1. An electrically programmable memory including:
    an array of a plurality of memory cells arranged accordingly to a NAND architecture, said memory cells grouped into a plurality of memory blocks, each memory block including a plurality of memory pages and each memory page including a plurality of columns of memory cells;
    means for receiving an address corresponding to a respective memory block having a memory page to be read or written;
    selecting means for selecting an addressed memory block;
    means for detecting a failure of the addressed memory block; and
    a page buffer for reading/programming the memory page corresponding to the received address,
    wherein the means for detecting a failure includes:
        a plurality of registers, each register corresponding to a respective memory block and storing an indication of the failure of the respective memory block; and
        means for reading the register corresponding to the addressed memory block in response to the receiving of the address,
    in that the page buffer includes the means for reading the register corresponding to the addressed memory block,
    and in that the programmable memory further includes at least one redundant memory block of memory cells including redundant memory columns, the selecting means selecting a single redundant memory block having three or more redundant memory columns of memory cells to replace the addressed memory block in response to the reading of the indication of the failure.

2. An electrically programmable memory including:
an array of a plurality of memory cells arranged accordingly to a NAND architecture, said memory cells grouped into a plurality of memory blocks, each memory block including a plurality of memory pages and each memory page including a plurality of columns of memory cells;
means for receiving an address corresponding to a respective memory block;
selecting means for selecting an addressed memory block; and
means for detecting a failure of the addressed memory block, wherein the means for detecting a failure includes:
a plurality of registers, each register corresponding to a respective memory block and storing an indication of the failure of the respective memory block; and
means for reading the register corresponding to the addressed memory block in response to the receiving of the address,
in which the programmable memory further includes a plurality of redundant memory blocks of memory cells including redundant memory columns, the selecting means selecting a single one of the redundant memory blocks having three or more redundant memory columns of memory cells to replace the addressed memory block in response to the reading of the indication of the failure, in which the indication of the failure includes a redundancy address corresponding to the selected redundant memory block, and in which the means for reading further include means for providing the redundancy address to the selecting means.

3. The electrically programmable memory according to claim 2, in which each register includes a plurality of electrically programmable non-volatile memory cells for storing the indication of the failure of the respective memory block in a non-volatile way.

4. The electrically programmable memory according to claim 3, in which the plurality of electrically programmable non-volatile memory cells of the plurality of registers forms at least one further memory block including at least one further memory page of the electrically programmable non-volatile memory cells.

5. An electrically programmable memory including:
an array of a plurality of memory cells arranged accordingly to a NAND architecture, said memory cells grouped into a plurality of memory blocks, each memory block including a plurality of memory pages and each memory page including a plurality of columns of memory cells;
means for receiving an address corresponding to a respective memory block;
selecting means for selecting an addressed memory block;
means for detecting a failure of the addressed memory block;
means for verifying a failure of the addressed memory block in executing a requested operation;
means for updating an indication of the failure of the addressed memory block; and
a page buffer that includes the means for updating,
wherein
the means for detecting a failure includes:
a plurality of registers, each register corresponding to a respective memory block and storing an indication of the failure of the respective memory block; and
means for reading the register corresponding to the addressed memory block in response to the receiving of the address,
and in that the programmable memory further includes at least one redundant memory block of memory cells including a plurality of redundant memory columns, the selecting means selecting a single redundant memory block having three or more redundant memory columns of memory cells to replace of the addressed memory block in response to the reading of the indication of the failure.

6. The electrically programmable memory according to claim 5, further including control means for internally managing the means for updating.

7. A method of operating of an electrically programmable memory including an array of a plurality of memory cells arranged accordingly to a NAND architecture, said memory cells grouped into a plurality of memory blocks, each memory block including a plurality of memory pages and each memory page including a plurality of columns of memory cells, the method comprising:
receiving an address corresponding to a respective memory block;
selecting the addressed memory block; and
detecting a failure of the addressed memory block,
wherein
said detecting a failure includes:
storing an indication of the failure of each memory block in a plurality of registers included in the programmable memory, each register corresponding to a respective memory block; and
reading the indication of the failure from the register corresponding to the addressed memory block in response to the receiving of the address, and in that the method further includes:
providing at least one redundant memory block of memory cells including a plurality of redundant memory columns;
selecting a single redundant memory block having three or more redundant memory columns of memory cells to replace the addressed memory block in response to the reading of the indication of the failure, in which the indication of the failure includes a redundancy address corresponding to the selected redundant memory block; and
providing the redundancy address.

8. An integrated circuit, comprising:
matrix blocks of nonvolatile memory cells having a NAND architecture;
redundant blocks of nonvolatile memory cells having a NAND architecture;
a mapping memory operable to identify a defective one of the matrix blocks and to identify a single redundant block having three or more redundant columns of memory cells for replacing the defective matrix block;
an address decoder coupled to the matrix blocks, redundant blocks, and the mapping memory, and operable to select the identified single redundant block in response to the defective matrix block being addressed; and
a page buffer operable to update an indication of a matrix block as defective 9. The integrated circuit of claim 8 wherein the matrix blocks and the redundant blocks each have a plurality of columns.

10. The integrated circuit of claim 8 wherein the mapping memory:
- includes a register that corresponds to the defective matrix block and that is operable to store an address of the redundant memory block; and
- is operable to provide the address of the redundant memory block to the address decoder in response to the defective matrix block being addressed.

11. The integrated circuit of claim 8 wherein the mapping memory:
- includes a register that corresponds to the defective matrix block and that is operable to store a value that indicates that the defective matrix block is defective; and
- is operable to provide the value to the address decoder in response to the defective matrix block being addressed.

12. The integrated circuit of claim 8 wherein the mapping memory includes a register having sections that each correspond to a respective one of the matrix blocks and that each are operable to store a value that indicates whether the respective matrix block is functional or defective.

13. A method, comprising:
- addressing a matrix block of nonvolatile memory cells disposed on an integrated circuit;
- determining whether the addressed matrix block is defective using circuitry disposed on the integrated circuit to analyze contents of a register associated with the addressed matrix block;
- if the addressed matrix block is defective, then selecting a single redundant memory block having three or more redundant columns of memory cells to replace the addressed matrix block using circuitry disposed on the integrated circuit; and
- updating contents of the register associated with the addressed matrix block using a page buffer disposed on the integrated circuit.

* * * * *